United States Patent
Yoon et al.

(10) Patent No.: US 12,108,615 B2
(45) Date of Patent: Oct. 1, 2024

(54) INFRARED-EMITTING QUANTUM DOTS AND METHODS FOR MAKING SAME

(71) Applicant: Georgia Tech Research Corporation, Atlanta, GA (US)

(72) Inventors: Young Jun Yoon, Atlanta, GA (US); Zhiqun Lin, Atlanta, GA (US); Zhitao Kang, Atlanta, GA (US); Brent Wagner, Atlanta, GA (US); Jonathan Christopher James, Atlanta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 673 days.

(21) Appl. No.: 17/267,103

(22) PCT Filed: Aug. 21, 2019

(86) PCT No.: PCT/US2019/047443
§ 371 (c)(1),
(2) Date: Feb. 9, 2021

(87) PCT Pub. No.: WO2020/050979
PCT Pub. Date: Mar. 12, 2020

(65) Prior Publication Data
US 2021/0202870 A1      Jul. 1, 2021

Related U.S. Application Data (60) Provisional application No. 62/720,200, filed on Aug. 21, 2018.

(51) Int. Cl.
*C09K 11/56*   (2006.01)
*C09K 11/66*   (2006.01)
*C09K 11/88*   (2006.01)
*H10K 50/115*   (2023.01)

(52) U.S. Cl.
CPC ............ *H10K 50/115* (2023.02); *C09K 11/56* (2013.01); *C09K 11/661* (2013.01); *C09K 11/883* (2013.01)

(58) Field of Classification Search
CPC ....... H10K 50/115; C09K 11/02; H01L 33/50; B82Y 20/00
See application file for complete search history.

(56) References Cited

U.S. PATENT DOCUMENTS

| | | | |
|---|---|---|---|
| 8,247,795 B2 * | 8/2012 | Jun | C09K 11/565 257/17 |
| 9,637,682 B2 * | 5/2017 | Jun | B82Y 30/00 |
| 2010/0208172 A1 * | 8/2010 | Jang | B82Y 20/00 349/71 |
| 2013/0045499 A1 * | 2/2013 | Medintz | C07D 295/13 544/215 |
| 2014/0054540 A1 * | 2/2014 | Zhou | H01L 29/0665 438/22 |

(Continued)

*Primary Examiner* — Walter H Swanson
*Assistant Examiner* — Jacob T Nelson
(74) *Attorney, Agent, or Firm* — Troutman Pepper Hamilton Sanders LLP; Ryan A. Schneider; Jacob Burr (57) ABSTRACT

The disclosed technology includes an infrared-emitting quantum dot comprising a core comprising a first semiconductor material, a shell comprising a second semiconductor material, and a gradient interface between the core and the shell. The disclosed technology also includes methods of manufacturing the same.

17 Claims, 10 Drawing Sheets

(56) References Cited

U.S. PATENT DOCUMENTS

| | | | | |
|---|---|---|---|---|
| 2014/0158977 A1* | 6/2014 | Supran | ............... | H01L 33/28 |
| | | | | 438/47 |
| 2014/0302627 A1* | 10/2014 | Ko | ............... | C09K 11/565 |
| | | | | 252/301.16 |
| 2017/0115823 A1* | 4/2017 | Huang | ............... | G06F 3/0421 |
| 2018/0039103 A1* | 2/2018 | Jang | ............... | H10K 50/30 |
| 2019/0389738 A1* | 12/2019 | Talapin | ............... | C22C 28/00 |
| 2020/0299575 A1* | 9/2020 | Ippen | ............... | C09K 11/70 |

* cited by examiner

| Cation Exchange | Density | Molar Weight | Molar Volume | Expected Volume Increase |
|---|---|---|---|---|
| CdSe (WZ) → PbSe (RS) | 5.81 g/cm³ (CdSe) 8.10 g/cm³ (PbSe) | 191.37 g/mol (CdSe) 286.16 g/mol (PbSe) | 32.94 cm³/mol (CdSe) 35.33 cm³/mol (PbSe) | 7.26% |
| CdSe (ZB) → PbSe (RS) | 5.66 g/cm³ (CdSe) 8.10 g/cm³ (PbSe) | 191.37 g/mol (CdSe) 286.16 g/mol (PbSe) | 33.81 cm³/mol (CdSe) 35.33 cm³/mol (PbSe) | 4.50% |
| CdS (ZB) → PbS (RS) | 4.82 g/cm³ (CdS) 7.60 g/cm³ (PbS) | 144.46 g/mol (CdS) 239.3 g/mol (PbS) | 29.97 cm³/mol (CdS) 31.49 cm³/mol (PbS) | 5.06% |
| ZnSe (ZB) → PbSe (RS) | 5.27 g/cm³ (ZnSe) 8.10 g/cm³ (PbSe) | 144.35 g/mol (ZnSe) 286.16 g/mol (PbSe) | 27.39 cm³/mol (ZnSe) 35.33 cm³/mol (PbSe) | 29.0% |
| ZnS (ZB) → PbS (RS) | 4.05 g/cm³ (ZnS) 7.60 g/cm³ (PbS) | 97.47 g/mol (ZnS) 239.3 g/mol (PbS) | 23.83 cm³/mol (ZnS) 31.49 cm³/mol (PbS) | 32.1% |

INFRARED-EMITTING QUANTUM DOTS AND METHODS FOR MAKING SAME

CROSS-REFERENCE TO RELATED APPLICATIONS

This application claims the benefit, under 35 U.S.C. § 119(e), of U.S. Provisional Patent Application No. 62/720,200, filed 21 Aug. 2018, the entire contents and substance of which is incorporated herein by reference in its entirety as if fully set forth below.

STATEMENT OF GOVERNMENT INTEREST

This invention was made with government support under Grant No. W56KGU-17-C-0053 awarded by the Department of Defense. The government has certain rights in the invention.

FIELD OF THE DISCLOSURE

The present disclosure relates generally to quantum dots and methods of making the same. More particularly, the present disclosure relates to infrared-emitting gradient quantum dots, infrared (IR) displays including IR-emitting gradient quantum dots, and methods of making IR-emitting gradient quantum dots.

BACKGROUND

Hardware-in-the-loop testing of IR-seeking missiles and missile warning systems that utilize imaging sensors can use of a variety of IR scene display technologies. For example, IR scene projectors can be used for laboratory- and field-testing of IR sensors. Two common IR scene display technologies are (1) arrays of resistive micro-emitters that serve as individually-programmable radiance sources of IR blackbody radiation and (2) liquid crystal on silicon or digital micro-mirror device (DMD) reflector arrays illuminated by a blackbody source, laser, or LED. However, disadvantages exists for these technologies.

For example, resistive emitter array technologies typically include a practical limit to the maximum achievable apparent blackbody temperature, which can be less than approximately 800 K in the mid-wave infrared (MWIR) and approximately 600 K in the long-wave infrared (LWIR). Further, resistive emitter array technologies generally have a relatively slow thermal time constant of the emitters which can preclude simulation of a fast-moving target against a static background. Regarding DMD technologies, there is generally an undesirable trade-off between frame rate and dynamic range, as pixel intensity is controlled by the duty cycle of the micro-mirror pixels as they are cycled between the "on" and "off" states. This trade-off can limit typical DMD projectors to limited frame rates and/or intensity control. Moreover, each of the above display technologies, including LCOS, typically lack the ability to control the spectral "color" of an image pixel (i.e., independent control of emissions within two or more bands). This incapability to independent control of emissions within two or more bands prevents such display technologies from being useful in the testing of advanced two-color MWIR and dual-band MWIR+LWIR imaging sensors, which are now being fielded.

Accordingly, there is a need for more adaptable IR scene projectors, for operation in multiband or even broadband, including all the IR wavelength regimes (i.e., short-range infrared (SWIR), MWIR, and LWIR). These and other concerns are addressed by the presently disclosed subject matter.

SUMMARY

Briefly described, the presently disclosed subject matter relates to infrared-emitting gradient quantum dots, infrared (IR) displays including IR-emitting gradient quantum dots, and methods of making IR-emitting gradient quantum dots.

The disclosed technology include an infrared-emitting quantum dot that can include an inner core that can include a first semiconductor material, a second semiconductor shell that can include a second semiconductor material, and a gradient interface between the core and the shell. The gradient interface can include the first and second semiconductor materials.

In any of the embodiments disclosed herein, the core can be spherically-shaped.

In any of the embodiments disclosed herein, the gradient interface can have an inner radius proximate the core and an outer radius proximate the shell. A concentration of the first semiconductor material in the gradient interface at the inner radius can be greater than a concentration of the first semiconductor material at the outer radius, and/or a concentration of the second semiconductor material in the gradient interface at the inner radius can be lesser than a concentration of the second semiconductor material at the outer radius.

In any of the embodiments disclosed herein, the gradient interface can have an inner radius proximate the core and an outer radius proximate the shell. A concentration of the first semiconductor material in the gradient interface can continually decrease from the first inner radius to the outer radius, and/or a concentration of the second semiconductor material in the gradient interface can continually increase from the inner radius to the outer radius.

In any of the embodiments disclosed herein, the first semiconductor material can comprise a group II-IV semiconductor material.

In any of the embodiments disclosed herein, the first semiconductor material can comprise a group III-V semiconductor material.

In any of the embodiments disclosed herein, the infrared-emitting quantum dot can be configured to emit IR light in the short-range infrared range.

In any of the embodiments disclosed herein, the infrared-emitting quantum dot can be configured to emit IR light in the mid-range infrared range.

The disclosed technology can include a method of manufacturing a plurality of infrared-emitting quantum dots, and the method can comprise synthesizing a plurality of nanotemplate quantum dots and performing a cation exchange reaction, thereby transforming the plurality of nanotemplate quantum dots into the plurality of infrared-emitting quantum dots.

In any of the embodiments disclosed herein, the plurality of nanotemplate quantum dots can be visual-light-emitting quantum dots.

In any of the embodiments disclosed herein, each of the plurality of nanotemplate quantum dots can have a core, a shell, and a gradient interface between the core and the shell.

In any of the embodiments disclosed herein, the plurality of nanotemplate quantum dots can be $CdSe/Cd_{1-x}Zn_xSe_{1-y}S_y/ZnS$ quantum dots.

In any of the embodiments disclosed herein, performing the cation exchange reaction can comprise applying lead-salt to the plurality of nanotemplate quantum dots.

In any of the embodiments disclosed herein, performing the cation exchange reaction can comprise applying mercury-salt to the plurality of nanotemplate quantum dots.

In any of the embodiments disclosed herein, performing the cation exchange reaction can comprise applying silver-salt to the plurality of nanotemplate quantum dots.

In any of the embodiments disclosed herein, the method can further comprise, after an initial cation exchange, maintaining the plurality of infrared-emitting quantum dots in contact with lead-salt, mercury-salt, or silver-salt for a predetermined time, thereby synthesizing outer shells having a predetermined thickness for each of the plurality of infrared-emitting quantum dots.

In any of the embodiments disclosed herein, the method can further comprise applying the plurality of infrared-emitting quantum dots to a substrate to form a quantum dot panel.

In any of the embodiments disclosed herein, applying the plurality of infrared-emitting quantum dots to the substrate can comprise arranging the plurality of infrared-emitting quantum dots into a plurality of sub-pixel arrays. The plurality of sub-pixel arrays can comprise a first sub-pixel array configured to emit IR light at a first wavelength and a second sub-pixel array configured to emit IR light at a second wavelength that is different from the first wavelength.

In any of the embodiments disclosed herein, the first sub-pixel array and second sub-pixel array can be configured to concurrently emit the first and second wavelengths, respectively.

The disclosed technology can include a quantum dot panel comprising a substantially transparent substrate and a plurality of infrared-emitting quantum dots disposed on a surface of the substantially transparent substrate. Each of the plurality of infrared-emitting quantum dots can comprise a first semiconductor core comprising at least one of PbSe, $Ag_2Se$, and HgSe; a second semiconductor shell comprising at least one of PbS, $Ag_2S$, and HgS; and a gradient interface between the core and the shell, the gradient interface comprising at least one of $PbSe_{1-y}S_y$, $Ag_2Se_{1-x}S_x$, and $HgSe_{1-x}S_x$.

The foregoing summarizes only a few aspects of the presently disclosed subject matter and is not intended to be reflective of the full scope of the presently disclosed subject matter as claimed. Additional features and advantages of the presently disclosed subject matter are set forth in the following description and/or may be apparent from the description or by practicing the presently disclosed subject matter. Moreover, both the foregoing summary and following detailed description are exemplary and explanatory and are intended to provide further explanation of the presently disclosed subject matter as claimed.

BRIEF DESCRIPTION OF THE DRAWINGS

The accompanying drawings, which are incorporated in and constitute a part of this specification, illustrate multiple embodiments of the presently disclosed subject matter and, together with the description, serve to explain the principles of the presently disclosed subject matter; and, furthermore, are not intended in any manner to limit the scope of the presently disclosed subject matter.

DETAILED DESCRIPTION

The various embodiments of the presently disclosed subject matter are described with specificity to meet statutory requirements. However, the description itself is not intended to limit the scope of this patent. Rather, it has been contemplated that the claimed subject matter might also be embodied in other ways, to include different steps or elements similar to the ones described in this document, in conjunction with other present or future technologies.

It should also be noted that, as used in the specification and the appended claims, the singular forms "a," "an" and "the" include plural references unless the context clearly dictates otherwise. References to a composition containing "a" constituent is intended to include other constituents in addition to the one named. Also, in describing the preferred embodiments, terminology will be resorted to for the sake of clarity. It is intended that each term contemplates its broadest meaning as understood by those skilled in the art and includes all technical equivalents which operate in a similar manner to accomplish a similar purpose.

Ranges and/or sizes may be expressed herein as from "about" or "approximately" one particular value and/or to "about" or "approximately" another particular value. When such a range or size is expressed, other exemplary embodiments include from the one particular value and/or to the other particular value. Herein, the use of terms such as "having," "has," "including," or "includes" are open-ended and are intended to have the same meaning as terms such as "comprising" or "comprises" and not preclude the presence of other structure, material, or acts. Similarly, though the use of terms such as "can" or "may" is intended to be open-ended and to reflect that structure, material, or acts are not necessary, the failure to use such terms is not intended to reflect that structure, material, or acts are essential. To the extent that structure, material, or acts are presently considered to be essential, they are identified as such.

It is also to be understood that the mention of one or more method steps does not preclude the presence of additional method steps or intervening method steps between those steps expressly identified. Moreover, although the term "step" may be used herein to connote different aspects of methods employed, the term should not be interpreted as implying any particular order among or between various steps herein disclosed unless and except when the order of individual steps is explicitly required.

To facilitate an understanding of the principles and features of the invention, various illustrative embodiments are explained below. In particular, the presently disclosed subject matter is described in the context of being a connector system for assembling an artificial tree. Embodiments of the presently disclosed subject matter, however, are not limited to use in artificial tree. Rather, embodiments of the invention can be used for assembling other objects, such as poles.

Referring now to the figures, wherein like reference numerals represent like parts throughout the views, the connector system will be described in detail.

As discussed above, existing IR scene projectors typically have shortcomings that limit their usefulness in IR sensor testing (e.g., hardware-in-the-loop testing) and other applications. Moreover, while quantum dots (nanoparticle semiconductors) have previously been investigated and used in visible-light emitting applications, efficient and stable IR-emitting quantum dots have yet to be fully realized. For example, existing IR-emitting quantum dots typically have a low band gap and low chemical stability in ambient environments. Further, it can be difficult to precisely tune and maintain the target optical characteristics of existing IR-emitting quantum dots.

Figure 1:
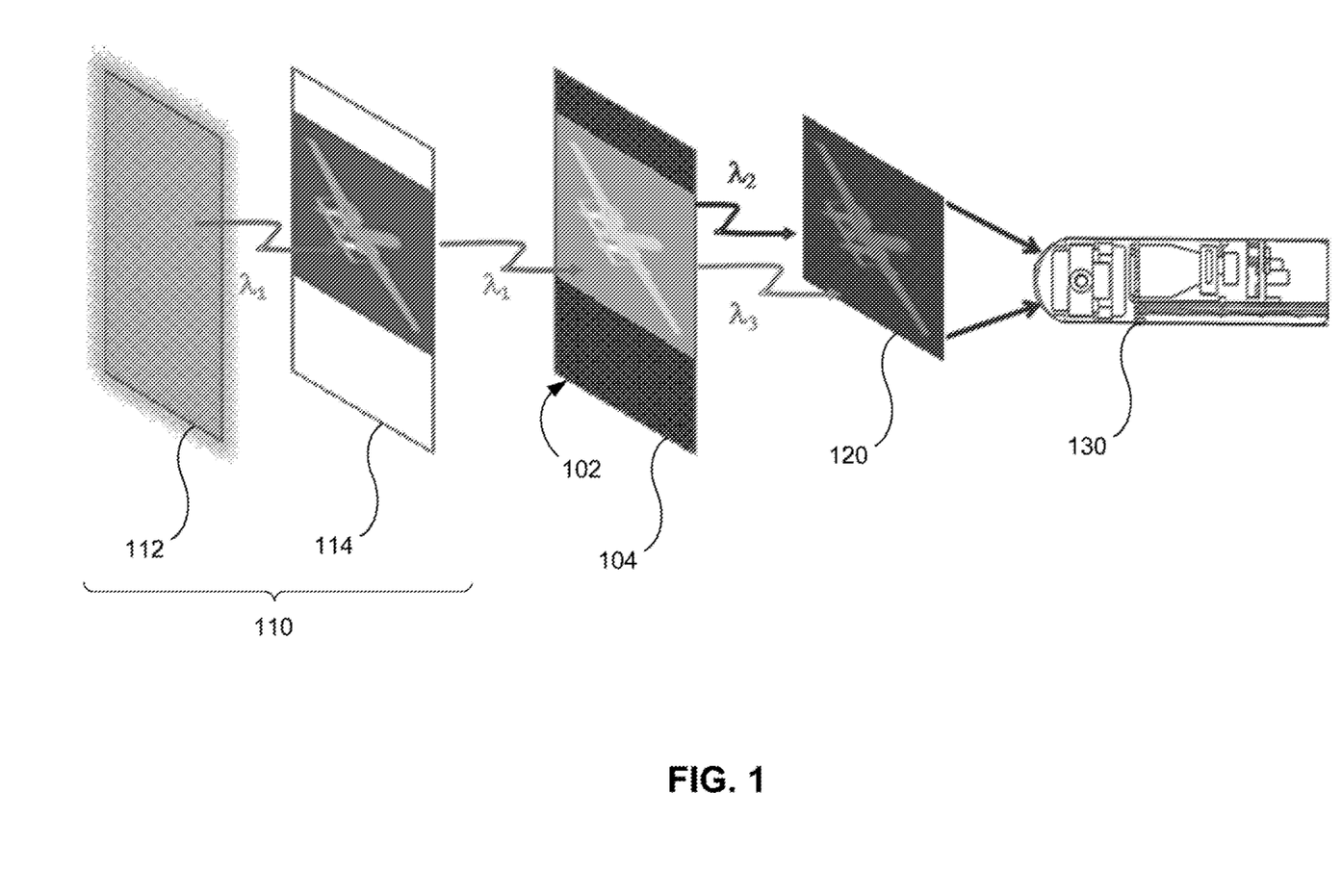
FIG. 1 is a schematic diagram depicting an IR scene projector technology, in accordance with the presently disclosed subject matter.

The disclosed technology can be useful for the development of quantum-dot-based IR scene projector technology. Such IR scene projector technology can be more efficient, more robust, and cheaper to manufacture than existing resistive array and DMD projectors. For example, referring to FIG. 1, IR emitting quantum dot materials 102 can be deposited or printed onto a "color conversion layer" (e.g., a quantum dot panel or layer 104) that can be attached to a display 110. The display 110 can be commercially available and/or off-the-shelf. The display 110 can include a display backlight 112 and a viewing panel 114. The display backlight 112 can include any useful technology, such as cold cathode, fluorescent, light-emitting diodes (LEDs), Vis-NIR-SWIR, or any other useful light source. The viewing panel 114 can include a liquid crystal display (LCD) panel. The viewing panel 114 (e.g., LCD panel) can be a high-performance viewing panel 114 (e.g., having a sufficiently high resolution and/or frame rate). For example, the viewing panel 114 can have a frame rate of at least 200 Hz. As another example, the viewing panel 114 can have a resolution of at least 720p or at least 1080p or at least 3840×2160 pixels or at least 4096×2160 pixels.

The IR quantum dot materials 102 can have characteristics such that light $2i$ emitted from the standard display 110 causes the IR quantum dot 102 to emit light in a predetermined IR spectral bands. For example, the IR quantum dot 102 can be configured to emit light in a predetermined IR spectral band that is in a range between and including SWIR and LWIR wavelengths. Further, the IR quantum dot 102 can be printed or patterned into sub-pixel arrays on the quantum dot panel 104, and groups of these sub-pixel arrays can be configured to emit light at different wavelengths, depicted as $\lambda_2$ and $\lambda_3$ in FIG. 1. Thus, the groups of arrays can provide multiple color MWIR displays, and the arrays of IR quantum dot 102 can be tunable to specific, predetermined wavelengths (or ranges of wavelengths) of interest. Stated otherwise, light $2\backslash4$ produced by the display 110 can be absorbed by the quantum dots 102 of the quantum dot layer 104 and converted to a radiometrically-accurate MWIR image, which can be used to test two-color missile warning systems or other IR-detecting instruments. This concept can thus support multi-spectral scene projector technology which can support sensor and countermeasure system laboratory efforts.

MWIR semiconductor nanocrystals, or so-called quantum dots, have a wide variety of applications, including use with lasers, photodetectors, and photoimaging devices. Colloidal quantum dots have interesting optical properties related to their band gaps called photoluminescence, where the quantum dots emit light emission after absorbing photons. In order to obtain photoluminescence and absorbance in the MWIR range (e.g., approximately 2.5 μm to approximately 5 μm), materials with narrow band gap (e.g., less than approximately 0.4 eV) are required. Narrow band gap semiconductors can include lead chalcogenides (e.g., PbS, PbSe, PbTe) quantum dots. The band gap of these semiconductors (i.e., quantum dots) can be further fine-tuned by changing their sizes to below their Bohr radii, a phenomenon called the quantum confinement effect. But although PBSe quantum dots may have the narrowest band gap among these three lead chalcogenides, they are also well-known for their instability under ambient conditions (e.g., susceptible to oxidation in air). PbSe quantum dots dispersed in hexane and stored in air can undergo oxidation of up to 50% of its original volume in only a few hours. Further, it has been reported that exposure of PbSe quantum dots to air for 24 hours can substantially shift the photoluminescence band of the PbSe quantum dots and can increase the full width at half maximum of the PbSe quantum dots.

The disclosed technology relates to methods for generating quantum dots precisely tuned spatial composition to accurately control optical properties of the quantum dots in the IR region while simultaneously enhancing stability of the quantum dots. Methods for generating the IR quantum dots can include creating nanotemplate and transforming the nanotemplates to IR quantum dots, each having a predetermined size and predetermined material characteristics, via cation exchange. The nanotemplate can comprise inorganic materials. The nanotemplate can consist of inorganic materials. The nanotemplate can comprise a core, a graded or gradient layer, and an outer shell. Likewise, the resulting IR quantum dots can comprise a core, a graded or gradient layer, and an outer shell.

Creating the nanotemplate can include synthesizing $CdSe/Cd_{1-x}Zn_xSe_{1-y}S_y/ZnS$ quantum dots (i.e., nanotemplates) with precisely-tuned spatial composition by utilizing the different chemical reactivity of the four component atoms. Transforming the nanotemplates to IR quantum dots can comprise replacing the Cd and Zn cations with cations of interest (e.g., Pb, Ag, Hg) without disturbing the anionic framework of the nanotemplates. This can result in the synthesis of IR quantum dots (e.g., $PbSe/PbSe_{1-y}S_y/PbS$ quantum dots, $Ag_2Se/Ag_2Se_{1-x}S_x/Ag_2S$ quantum dots, $HgSe/HgSe_{1-x}S_x/HgS$ quantum dots) with tailored dimensions. Notably, the bulk of the cation exchange reaction can occur in less than approximately five minutes, and any continued reaction time can provide a gradual and controllable increase in the thickness of the outer shell, which can provide precise control over optical properties via band gap alignment tuning of the core and shell materials.

According to the methods and techniques provided herein, the absorption properties of IR quantum dots can be precisely controlled during synthesis by (i) controlling the cation exchange time and/or (i) by tuning the optical wavelengths of the inorganic nanotemplate and/or controlling the dimensions of the initial nanotemplate (i.e., the $CdSe/Cd_{1-x}Zn_xSe_{1-y}S_y/ZnS$ quantum dots). Stated otherwise, the disclosed methods and techniques involve creating a nanotemplate in the form of a visible-light quantum dot (i.e., the $CdSe/Cd_{1-x}Zn_xSe_{1-y}S_y/ZnS$ quantum dots), which are more stable and easier to synthesize, and subsequently performing cation exchange to transform the visible-light quantum dots to IR quantum dots, resulting in a more precisely tailored and more stable IR quantum dots as compared to those synthesized using existing methods.

By first synthesizing a $CdSe/Cd_{1-x}Zn_xSe_{1-y}S_y/ZnS$ quantum dot as a nanotemplate, which is more readily characterizable (i.e., CdSe and ZnS have distinct lattice dimensions) than IR quantum dots, and then performing cation exchange to create the IR quantum dots (e.g., $PbSe/PbSe_{1-y}S_y/PbS$ quantum dots, $Ag_2Se/Ag_2Se_{1-x}S_x/Ag_2S$ quantum dots, HgS e/$HgSe_{1-x}S_x$/HgS quantum dots), it can be easier to determine the relationship between the crystal dimensions and optical properties. In contrast, it can be difficult to characterize $PbSe/PbSe_{1-y}S_y$ quantum dots synthesized directly at least in part because the crystal structures of PbSe and PbS is very similar.

Further, the cation exchange reaction can involve an instantaneous cation exchange reaction followed by slow growth of the outer shell layer. Growth of the outer shell layer can be achieved by simply extending the cation exchange time, which can improve the quantum dot stability and/or allow fine-tuning of the quantum dot's emission wavelength. Further still, the disclosed methods and techniques can prevent the core material (e.g., PbSe, $Ag_2Se$, HgSe) from ever being exposed to air because it is directly surrounded by a relatively thick outer shell (e.g., PbS, $Ag_2S$, HgS) in-situ, which can help ensure improved stability.

As a nonlimiting example, IR quantum dots synthesized according the disclosed methods and techniques can have absorption properties in the range of approximately 1000 nm to approximately 3000 nm. IR quantum dots synthesized according to the methods and techniques provided herein have been observed as having excellent colloidal stability in solution for several months and having substantially unchanged absorption wavelengths for more than 30 days.

Figure 2:
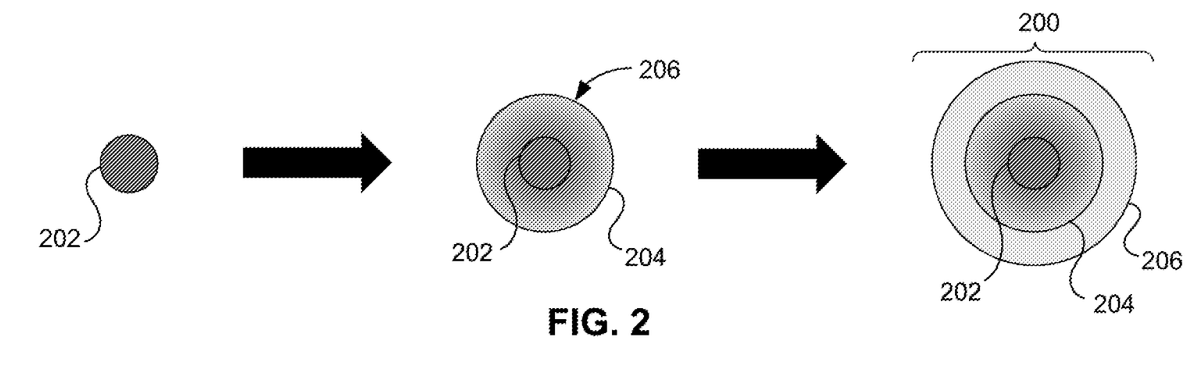
FIG. 2 is a schematic representation of a nanotemplate quantum dot, in accordance with the presently disclosed subject matter.

Referring to FIG. 2, a schematic representation of a $CdSe/Cd_{1-x}Zn_xSe_{1-y}S_y/ZnS$ quantum dot or nanotemplate 200 is provided. The nanotemplate can include a CdSe core 202, a thick passivating ZnS outer shell 206, and a composition gradient interface or layer 204 between the CdSe core 202 and ZnS shell 206. The gradient layer 204 between the core 202 and shell 206 can allow for the delocalization of electrons into the interfacial layer thus allowing a red-shift in the optical properties compared to the CdSe core size while also reducing the strain and instability caused by the lattice mismatch between the core and shell material. This composition gradient layer 204 can be achieved by capitalizing on the higher reactivity between Cd and Se compared to that between Zn and Se, thus allowing more Cd to occupy the inner core and more Zn to occupy the outer shell. The thick ZnS shell 206 can be achieved by adding an excess of Zn and S as compared to Cd and Se.

Figure 3:
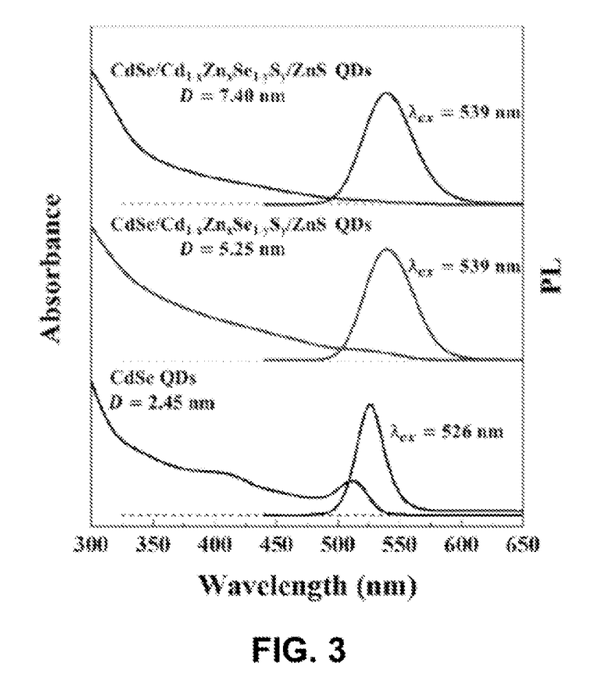
FIG. 3 is a graph depicting absorption and emission spectra of example nanotemplate quantum dots, in accordance with the presently disclosed subject matter.
Figure 4:
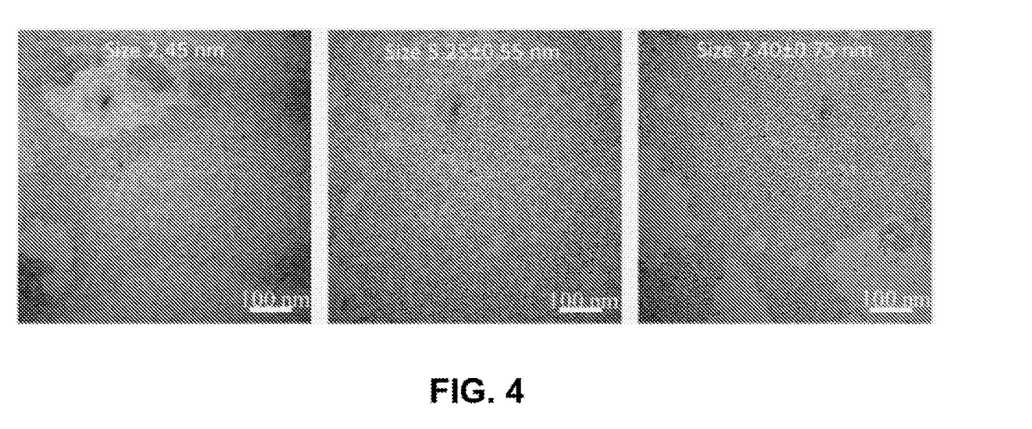
FIG. 4 shows TEM images of example nanotemplate quantum dots, in accordance with the presently disclosed subject matter.

FIG. 3 shows absorption and emission spectra and FIG. 4 TEM images of example nanotemplate quantum dots 200 prepared at 240° C. using 2.45 nm green-emitting CdSe quantum dots as seeds (i.e., core 202). The diameter of the nanotemplate quantum dots 200 shown in FIG. 4 increased from 2.45 nm for the as-prepared CdSe quantum dot core 202 (quantum dot size was 2.45 nm when calculated from the first exciton peak wavelength) to 5.25 nm for $CdSe/Cd_{1-x}Zn_xSe_{1-y}S_y/ZnS$ nanotemplate quantum dots 200 with a thin ZnS outer shell 206 and 7.40 nm for $CdSe/Cd_{1-x}Zn_xSe_{1-y}S_y/ZnS$ quantum dots 200 with a thick ZnS outer shell 206. From the photoluminescence peak position shift of 13 nm, a 6.5% increase of the effective core diameter due to the gradient interface between the core and shell material was estimated. As one monolayer of ZnS is 3.1 angstroms, the 5.25 nm $CdSe/Cd_{1-x}Zn_xSe_{1-y}S_y/ZnS$ quantum dots have approximately 4.3 ZnS layers while the 7.40 nm $CdSe/Cd_{1-x}Zn_xSe_{1-y}S_y/ZnS$ quantum dots have approximately 7.7 ZnS layers (monolayer of ZnS is 3.1 angstrom between consecutive planes along the [002] axis in bulk wurtzite ZnS).

Figure 5:
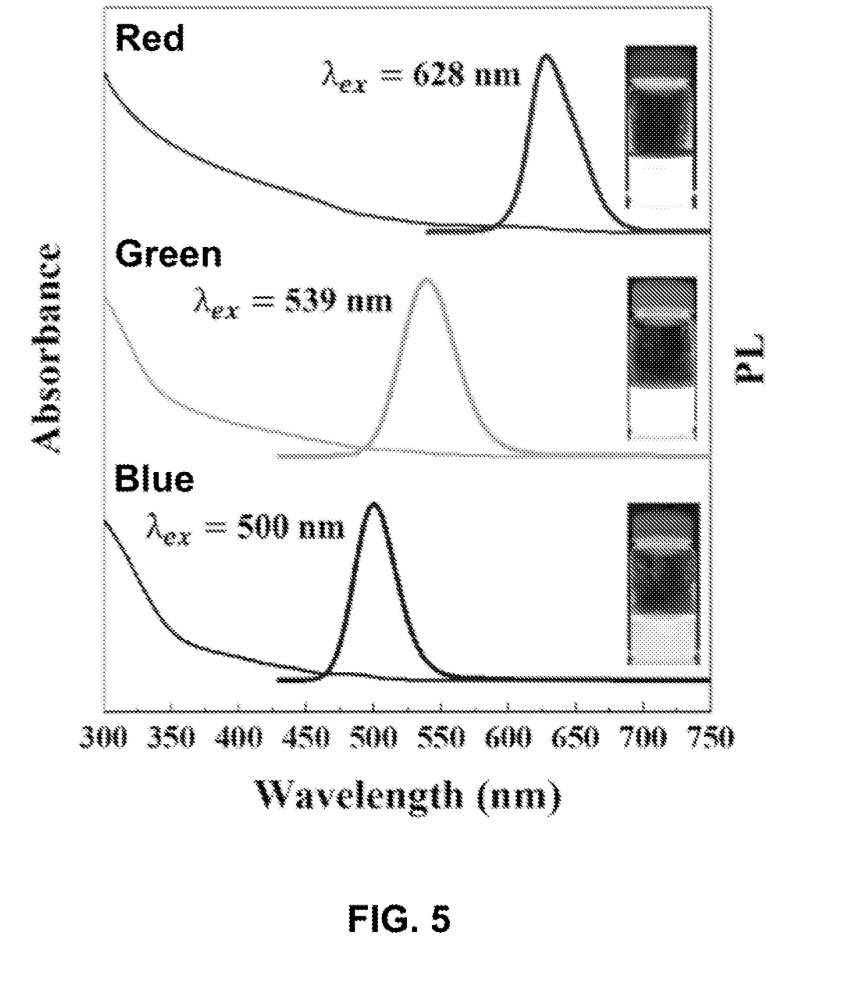
FIG. 5 is a graph showing the absorption and emission properties of three example nanotemplate quantum dots, in accordance with the presently disclosed subject matter.

FIG. 5 summarizes the absorption and emission properties of three example $CdSe/Cd_{1-x}Zn_xSe_{1-y}S_y/ZnS$ nanotemplate quantum dots 200, with FIG. 5(a) corresponding to a red color, FIG. 5(b) corresponding to a green color, and FIG. 5(c) corresponding to a blue color (from here on referred to as Red, Green, and Blue quantum dots 200). All three quantum dots have been synthesized by utilizing the chemical reactivity differences between the reactants to create a gradient interface but the specific synthesis procedures differ to achieve the three different emission colors. See Examples below for detailed recitation of the synthesis procedures regarding the example Red, Green, and Blue quantum dots 200.

Figure 6:
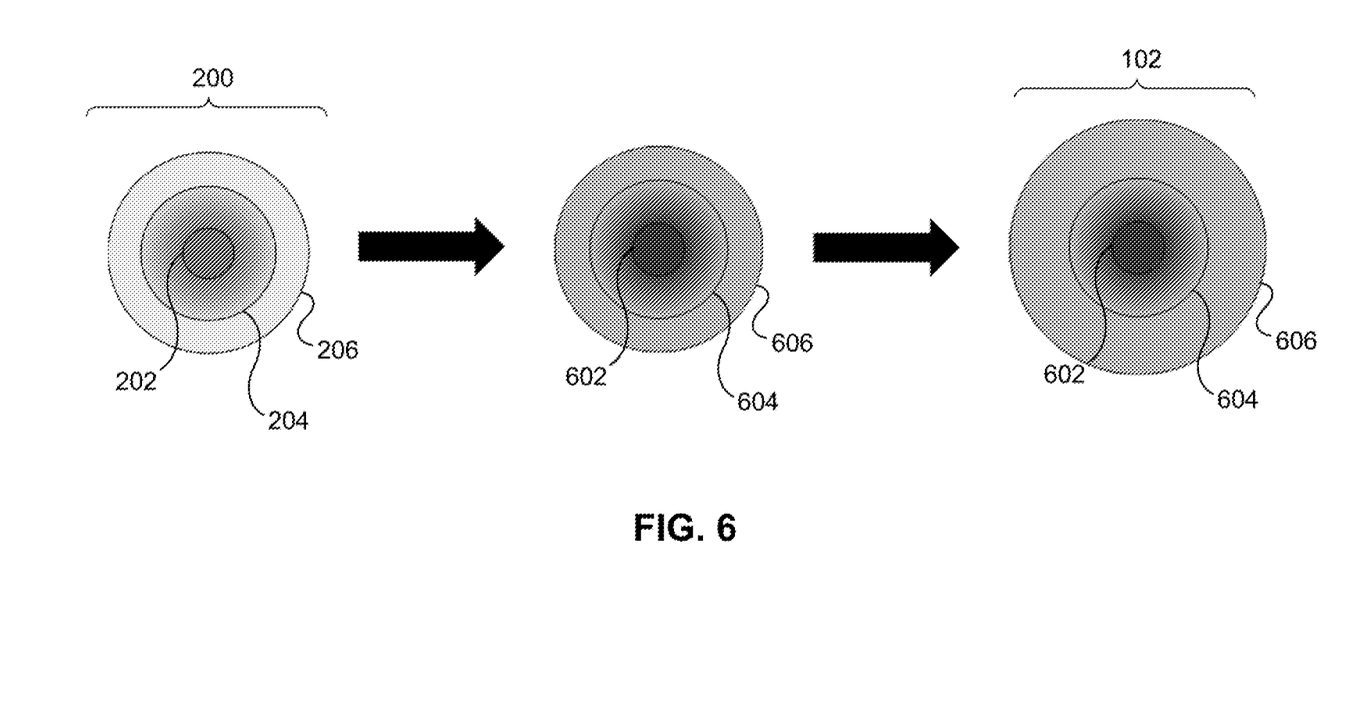
FIG. 6 is a schematic representation describing the conversion of nanotemplate quantum dots IR quantum dots, in accordance with the presently disclosed subject matter.

FIG. 6 is a schematic representation describing the synthetic scheme for converting the highly stable $CdSe/Cd_{1-x}Zn_xSe_{1-y}S_y/ZnS$ nanotemplate quantum dots 200 to IR quantum dots 102 in a one-step cation exchange reaction. During the cation exchange, the Cd atoms can be replaced by a predetermined substance, such as, for example, lead-salt, mercury-salt, or silver-salt. The core 602 can be a group III-V semiconductor material. The core 602 can be a group III-V semiconductor material. As one example, the IR quantum dot 102 can refer to a $PbSe/PbSe_{1-y}S_y/PbS$ quantum dot, with the core 602 being a PbSe core, the outer shell 606 being a PbS shell, and the gradient layer 604 being a $PbSe_{1-y}S_y$ layer. As another example, the IR quantum dot 102 can refer to an $Ag_2Se/Ag_2Se_{1-x}S_x/Ag_2S$ quantum dot, with the core 602 being an $Ag_2Se$ core, the outer shell 606 being an $Ag_2S$ shell, and the gradient layer 604 being an $Ag_2Se_{1-x}S_x$ layer. As yet another example, the IR quantum dot 102 can refer to an $HgSe/HgSe_{1-x}S_x/HgS$ quantum dot, with the core 602 being a HgSe core, the outer shell 606 being an HgS shell, and the gradient layer 604 being an $HgSe_{1-x}S_x$ layer. Regardless, the cation exchange process can be driven by the difference in solvation energy for the cations (i.e., the ligand's propensity for selective ion binding). After initial cation exchange, the shell 606 thickness continues to grow, and the thickness of the outer shell 606 is finely tunable to a predetermined thickness by simply altering the reaction time. This process can be understood in combination to the Ostwald ripening effect in which smaller particles dissolve and redeposit on larger particles. By utilizing the Ostwald ripening effects, the shell layer 606 on the quantum dots 102 can be precisely tunable along time scales that are precisely reproducible (e.g., PbS shell growth can take place over minutes and not seconds thus making experiments reproducible). The ability to precisely control the shell 606 thickness over a core 602 can be quite important. For example, in the case of PbSe/PbSe$_{1-y}$S$_y$/PbS quantum dots 606, they are Type-II core/shell quantum dots 102 in which the alignment of the band gap may allow emission red-shift as a function of the shell 606 thickness.

Environmental temperature can affect the reaction rate of the cation exchange reaction. For example, higher temperatures can cause the cation exchange to occur more quickly. If the temperature becomes too high, it may be difficult to control stability and/or the resulting size of the quantum dots.

Once the IR quantum dots 102 are synthesized, they can be purified from the synthesis solution using known techniques. After producing an amount of purified, colloidal IR quantum dots 102, the IR quantum dots 102 can be applied to a substrate. The substrate can be transparent, such as a piece of glass or plastic. Once the IR quantum dots are applied to the, for use as quantum dot layer or quantum dot screen 104 as described herein.

The synthesized IR quantum dots 102 can have photoluminescence and absorbance in the SWIR or MWIR ranges. Different types of quantum dots 102 can be useful for different target IR ranges. For example, PbSe/PbSe$_{1-y}$S$_y$/PbS quantum dots 102 can be useful for SWIR ranges, and HgSe/HgSe$_{1-x}$S$_x$/HgS quantum dots 102 can be useful for MWIR ranges.

Figure 7A:
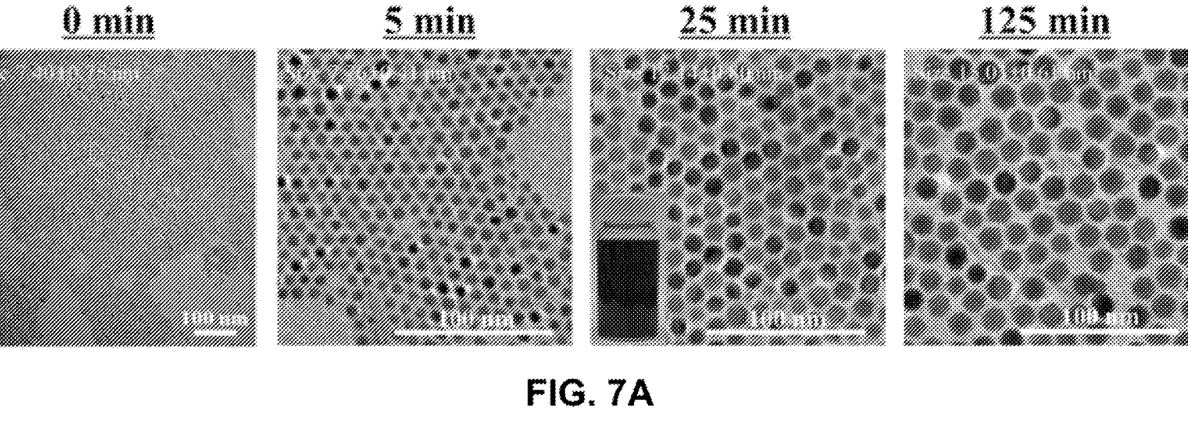
FIGS. 7A and 7B show TEM images of the chemical composition of example gradient $PbSe/PbSe_{1-y}S_y/PbS$ quantum dots, in accordance with the presently disclosed subject matter.
Figure 7B:
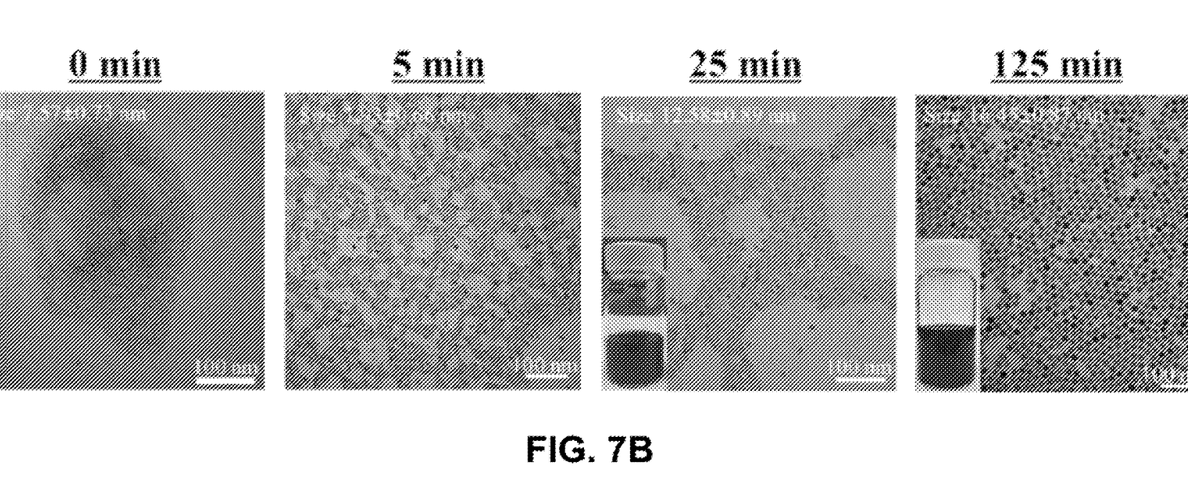

FIGS. 7A and 7B show TEM images of the chemical composition of example gradient PbSe/PbSe$_{1-y}$S$_y$/PbS quantum dots 102 prepared at 190° C. using CdSe/Cd$_{1-x}$Zn$_x$Se$_{1-y}$S$_y$/ZnS nanotemplate quantum dots 200. More specifically, FIG. 7A refers to an example cation exchange from 7.40 nm green-emitting CdSe/Cd$_{1-x}$Zn$_x$Se$_{1-y}$S$_y$/ZnS nanotemplate quantum dots 200, and FIG. 7B refers to an example cation exchange from 7.57 nm red-emitting CdSe/Cd$_{1-x}$Zn$_x$Se$_{1-y}$S$_y$/ZnS nanotemplate quantum dots 200. FIGS. 7A and 7B show both quantum dots 200, 102 before and after cation exchange as being quite monodisperse. During experimentation, a direct and simple indication of cation exchange was observed from the inset, in which the normally green or red cadmium-based quantum dots fully converted to a dark-brown color, which is reflective of lead-based quantum dots. Also from the inset, the lead-based quantum dot 102 became colloidally stable in solution. Even after six months of storage in air at room temperature, precipitation was not observed. The diameter of the quantum dots increased from 7.40±0.75 nm for the as-prepared CdSe/Cd$_{1-x}$Zn$_x$Se$_{1-y}$S$_y$/Zn S nanotemplate quantum dots to 7.76±0.41 nm for the PbSe/PbSe$_{1-y}$S$_y$/PbS quantum dots 102 (Green quantum dot cation exchange for 5 min) to 12.14±0.80 nm for the PbSe/PbSe$_{1-y}$S$_y$/PbS quantum dots 102 (Green quantum dot cation exchange for 25 min), and eventually to 15.03±0.61 nm for the PbSe/PbSe$_{1-y}$S$_y$/PbS quantum dots 102 (Green quantum dot cation exchange for 125 min). A monolayer of PbS is 1.2 nm. The 7.57±0.73 nm red-emitting CdSe/Cd$_{1-x}$Zn$_x$Se$_{1-y}$S$_y$/ZnS nanotemplate quantum dots 200 showed a similar trend in which the size increase was precisely controllable by a function of cation exchange time.

Figure 8:
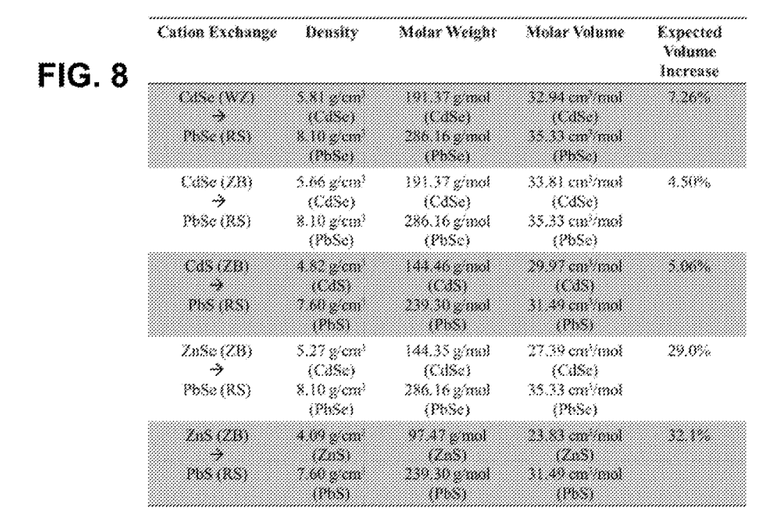
FIG. 8 is a table displaying expected volume increases during some examples of cation exchange, in accordance with the presently disclosed subject matter.

The quantum dot size can increase via at least two distinct processes. First, the crystal density of the reactant quantum dot 200 is much lower than that of the product quantum dot 102. Although the volumetric change in the core 202, 602 material from CdSe to PbSe was relatively small (4.5% increase from zinc-blende CdSe or 7.5% increase from wurtzite CdSe), the volumetric change in the shell 206, 606 material from ZnS to PbS was significant (32.1% increase from zinc-blende ZnS). These values track the expected volume increases shown in FIG. 8.

Figure 9:
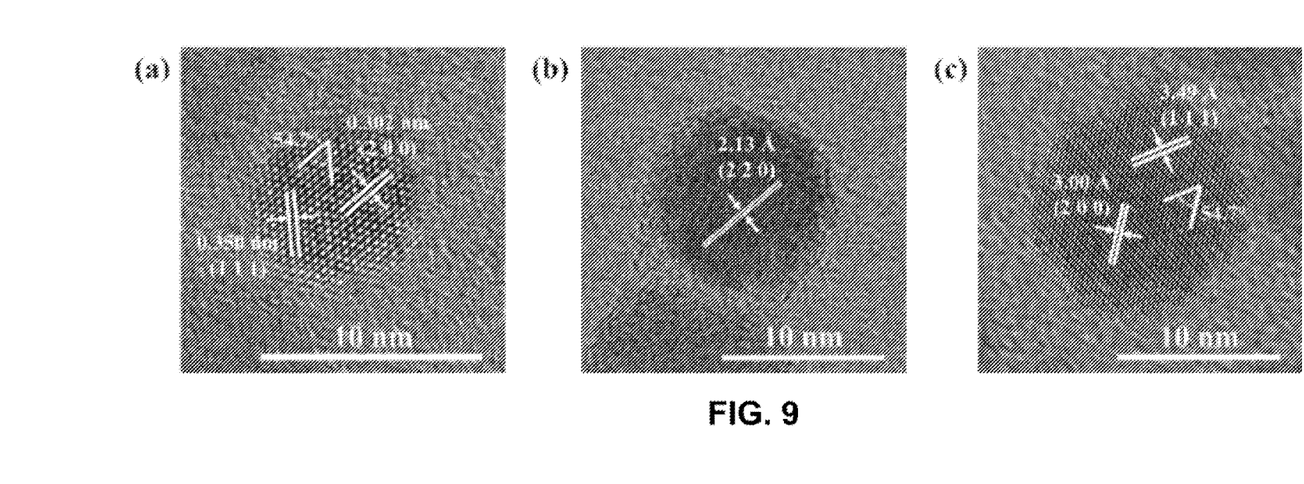
FIG. 9 shows HRTEM images of example $PbSe/PbSe_{1-y}S_y/PbS$ quantum dots, in accordance with the presently disclosed subject matter.

FIG. 9 shows HRTEM images of example PbSe/PbSe$_{1-y}$S$_y$/PbS quantum dots 102 that have excellent crystallinity. Due at least in part to the extremely small crystallographic mismatch between PbSe and PbS, only 3% the quantum dots appear to be a single crystal. The lattice spacing, however, show values that are intermediate of the characteristic values for PbSe (#78-1903) and PbS (#78-1900). For instance, the example PbSe/PbSe$_{1-y}$S$_y$/PbS quantum dots 102 (Green quantum dot cation exchange for 5 min) had a lattice spacing of 0.350 nm (1 1 1) that was between that of 0.353 nm for PbSe and that of 0.342 nm for PbS. This observation also agrees well with the intermediate XRD peaks discussed in more detail below.

Figure 10A:
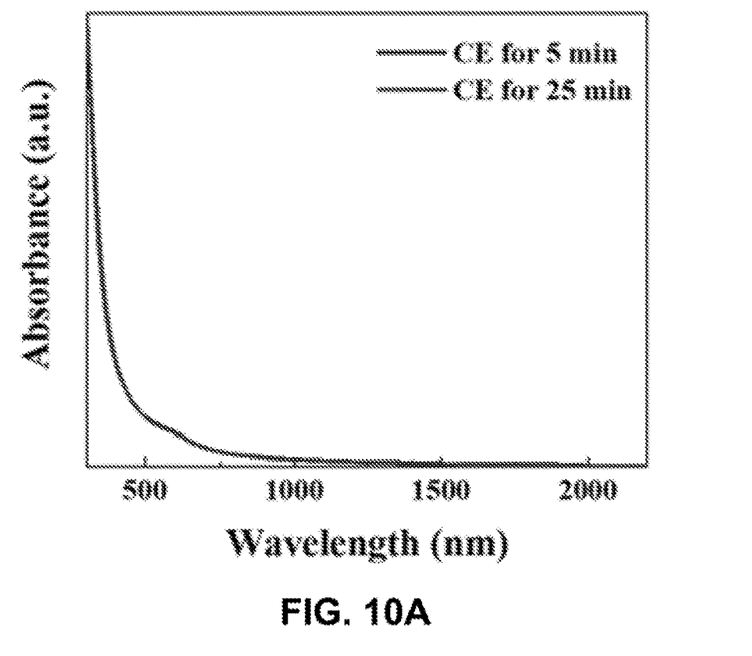
FIGS. 10A and 10B are graphs showing the absorption peak of example $PbSe/PbSe_{1-y}S_y/PbS$ quantum dots, in accordance with the presently disclosed subject matter.
Figure 10B:
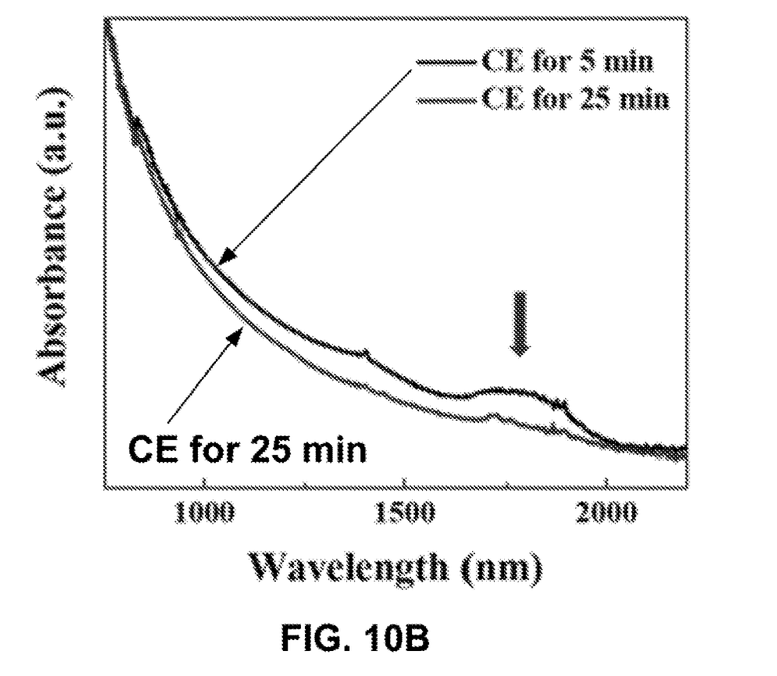

FIG. 10A shows the suppressed absorption peak of the example PbSe/PbSe$_{1-y}$S$_y$/Pb S quantum dots 102 due to the thick outer PbS shell 606. The first exciton absorption peak is unobservable when viewed over the entire spectrum. Zooming in as shown in FIG. 10B, the presence of a weak first exciton absorption peak can be seen at approximately 1800 nm. As the PbSe/PbSe$_{1-y}$S$_y$/PbS quantum dot 102 size increases from 7.76 nm (Green quantum dots cation exchange for 5 min) to 12.14 nm (Green quantum dots cation exchange for 25 min), however, even this absorption peak at 1800 nm is clearly suppressed due to the absorption primarily from the thick PbS shell 102.

Figure 11:
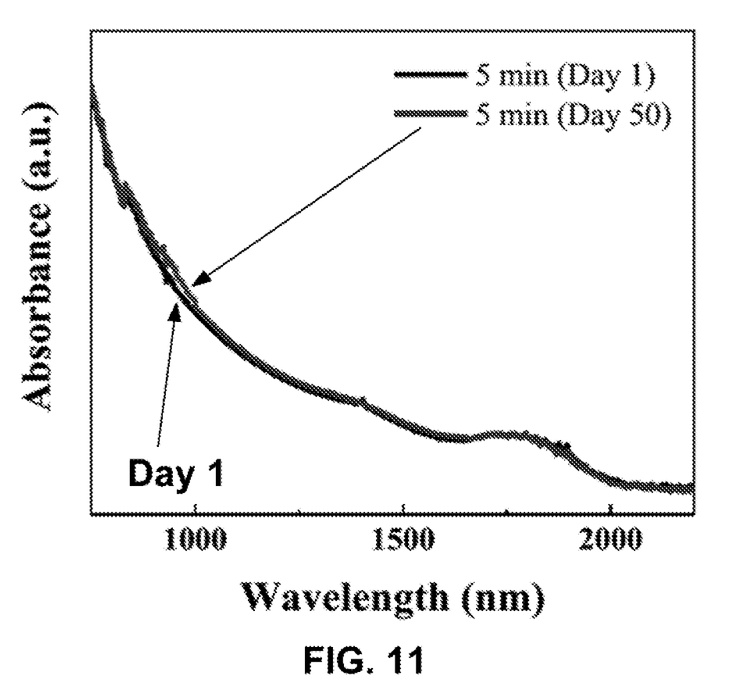
FIG. 11 is a graph showing the stability of example $PbSe/PbSe_{1-y}S_y/PbS$ quantum dots, in accordance with the presently disclosed subject matter.

FIG. 11 shows the stability of the example PbSe/PbSe$_{1-y}$S$_y$/PbS quantum dots 102 by measuring absorption peak position after storage in an ambient environment, which included being exposed to light and air at room temperature while dispersed in tetrachloroethylene for 50 days. It has been reported that PbSe quantum dots, which are easily oxidized when exposed to air, will show a blue shift in the absorption peak in less than a week. In stark contrast, the example PbSe/PbSe$_{1-y}$S$_y$/PbS quantum dots 102 showed no noticeable shift in absorption peak position after 50 days.

Figure 12:
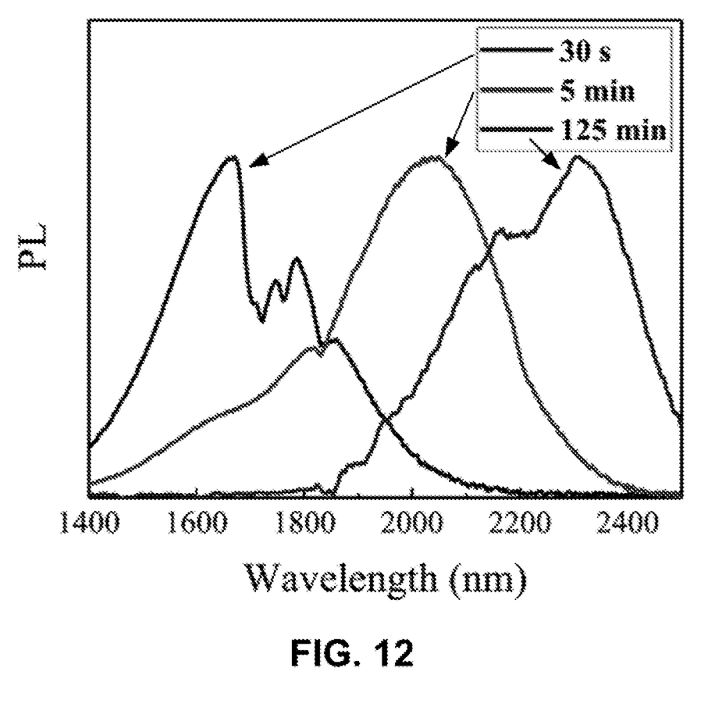
FIG. 12 is a graph showing the photoluminescence of example $PbSe/PbSe_{1-y}S_y/PbS$ quantum dots, in accordance with the presently disclosed subject matter.

FIG. 12 shows the photoluminescence of the example PbSe/PbSe$_{1-y}$S$_y$/PbS quantum dots 102 after different cation exchange times. PbSe/PbSe$_{1-y}$S$_y$/PbS quantum dots 102 with clear IR emission were successfully synthesized. A constant red-shift in the photoluminescence emission was observed in the example quantum dots 102 as the cation exchange reaction continued. After a 125 min cation exchange reaction, the photoluminescence was at approximately 2300 nm, which is a distinct shift from approximately 1700 nm (cation exchange for 30 s) or approximately 2050 nm (cation exchange for 5 min). This result contradicts existing reports on PbSe/PbS quantum dots in which a change in the PbS layer thickness eventually resulted in an emission blue-shift. For a PbSe-core-only quantum dot, a 2300 nm photoluminescence peak would correspond to approximately 9 nm. From the absorption data of the example red-emitting CdSe/Cd$_{1-x}$Zn$_x$Se$_{1-y}$S$_y$/Zn S quantum dots 200 in shown in FIG. 5, the effective core size (i.e., size of the CdSe/Cd$_{1-x}$Zn$_x$Se$_{1-y}$S$_y$) is calculated to be approximately 5.3 nm. Even considering the size increase of the effective core size after cation exchange due to the increase in molar volume, the effective core size cannot increase to 9 nm (which would be a near 70% increase). Thus, it can be concluded that the photoluminescence extension to approximately 2300 nm is influenced by the PbS shell layer 606. As for the broad shoulder at low wavelengths (approximately 1400 to approximately 1800 nm) observed for the PbSe/

PbSe$_{1-y}$S$_y$/PbS quantum dots 102 (cation exchange for 5 min), this was likely caused by quantum dots that had not been fully cation exchanged, which is corroborated by the photoluminescence emission peak for the PbSe/PbSe$_{1-y}$S$_y$/PbS quantum dots (cation exchange for 125 min) that has no shoulder peak as the quantum dot has been fully cation exchanged. The undulation (approximately 1680 to approximately 1860 nm) in the photoluminescence curve for PbSe/PbSe$_{1-y}$S$_y$/PbS quantum dots 102 (cation exchange for 30 s) was due to the absorption from the hexane solvent.

Figure 13:
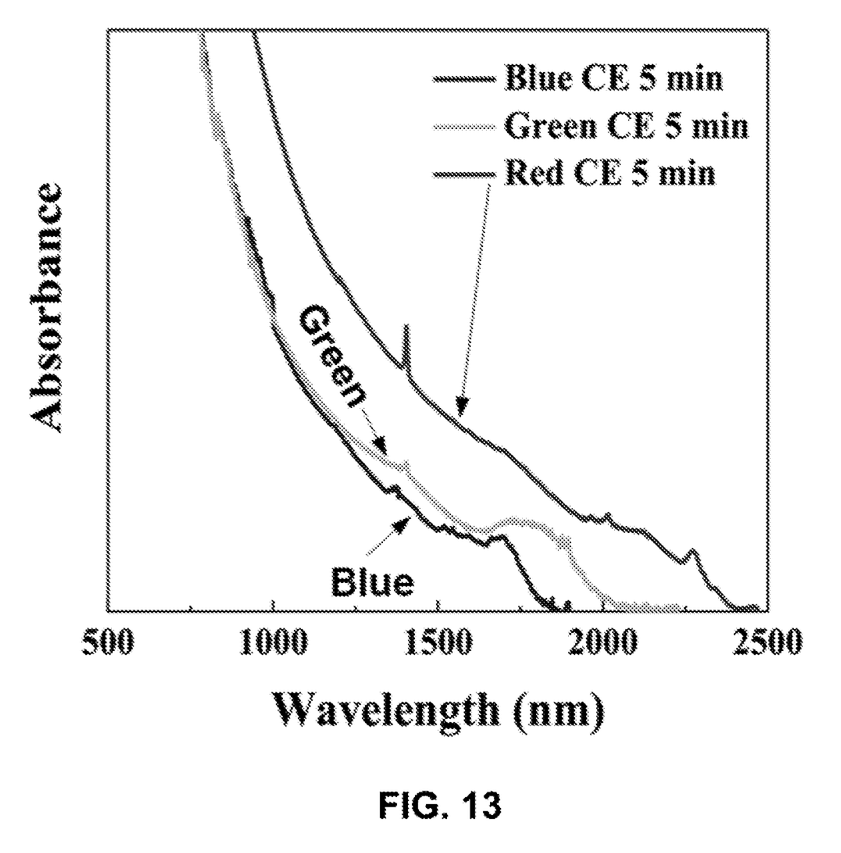
FIG. 13 is a graph showing the absorbance of example $PbSe/PbSe_{1-y}S_y/PbS$ quantum dots that were each synthesized by utilizing red, green, and blue $CdSe/Cd_{1-x}Zn_xSe_{1-y}S_y/ZnS$ nanotemplate quantum dots, in accordance with the presently disclosed subject matter.

In addition to controlling the optical properties (e.g., absorption, photoluminescence) of IR quantum dots via cation exchange reaction time, the initial CdSe/Cd$_{1-x}$Zn$_x$Se$_{1-y}$S$_y$/ZnS nanotemplate quantum dot 200 emission wavelength or size can influence the optical properties of the IR quantum dots 102 after identical cation exchange times. Referring to FIG. 13, the absorbance of example PbSe/PbSe$_{1-y}$S$_y$/PbS quantum dots 102 that were each synthesized by utilizing red, green, and blue CdSe/Cd$_{1-x}$Zn$_x$Se$_{1-y}$S$_y$/ZnS nanotemplate quantum dots 200 is show. All three cation exchange reactions were performed for 5 min. The PbSe/PbSe$_{1-y}$S$_y$/PbS quantum dot synthesized from the red-emitting CdSe/Cd$_{1-x}$Zn$_x$Se$_{1-y}$S$_y$/ZnS nanotemplate quantum dot 200 (red emission wavelength=628 nm) absorbed at approximately 2100 nm while those synthesized from CdSe/Cd$_{1-x}$Zn$_x$Se$_{1-y}$S$_y$/ZnS nanotemplate quantum dots 200 with a smaller core (green emission wavelength=539 nm; blue emission wavelength=500 nm) absorbed at approximately 1800 nm and approximately 1700 nm, respectively. This is because the cation exchange process simply replaces the Cd and Zn cations with Pb cations from the sturdier Se and S anionic framework. The extent to which the Se and S atoms are situated in the original quantum dot is relatively fixed such that the size of the original CdSe core decides the size of the final PbSe core dimensions, as well. Thus, it can be concluded that the change in optical properties of CdSe/Cd$_{1-x}$Zn$_x$Se$_{1-y}$S$_y$/ZnS nanotemplate quantum dots 200 via precise control of quantum dot dimensions can be directly translated into optical property changes of the resulting IR quantum dots 102 (e.g., PbSe/PbSe$_{1-y}$S$_y$/PbS quantum dots, Ag$_2$Se/Ag$_2$Se$_{1-x}$S$_x$/Ag$_2$S quantum dots, HgSe/HgSe$_{1-x}$S$_x$/HgS quantum dots).

EXAMPLES

Materials used during example experiments include: Lead (II) chloride (PbCl$_2$) (ultra-dry, 99.999%), selenium powder (200 mesh, 99.999%), sulfur powder (precipitated, 99.5%) cadmium oxide (98.9%), zinc acetate dihydrate (ZnAc$_2$) (ACS reagent grade, 98.0~101.0%), trioctylphosphine oxide (TOPO) (>98%), 1-octadecene (ODE) (tech. grade, 90%), oleic acid (OA) (tech. grade, 90%), and tetrachloroethylene (TCE) (ultrapure, spectrophotometric grade, 99+%) were obtained from Alfa Aesar. Trioctylphosphine (TOP) (97%), octadecylphosphonic acid (ODPA) (97%), and zinc acetylacetonate hydrate was obtained from Sigma-Aldrich. 1-dodecanethiol (>98%) was obtained from Sigma-Aldrich. Oleylamine (OAm) (50.0%) was obtained from TCI Chemicals. Toluene, hexane and methanol (ACS reagent grade) were obtained from BDH Chemicals. All chemicals were used as received without any further purification.

Preparation of green-emitting CdSe Quantum Dots: ODPA-capped CdSe quantum dots were synthesized. A mixture of CdO (50 mg), ODPA (400 mg), and TOPO (4 g) was placed in a three-neck flask and degassed at 140° C. for 1 hour. The temperature was then raised to 290° C. After complete solubilization of the reactants that the solution became transparent and colorless, 1 ml of 1M Se/TOP solution was quickly injected into the reaction flask to initiate nucleation and growth. The heating mantle was removed after 1 sec and the reaction flask was quickly placed in a water bath. 5 ml of toluene was added as the reaction solution reached 60° C. The resulting ODPA-capped CdSe quantum dots were precipitated with methanol twice and dispersed in toluene.

Preparation of Cd-oleate and Zn-oleate Precursor Solution: 154 mg CdO, 1581 mg zinc acetyl acetonate, 90 ml ODE, and 30 ml OA were placed in 250 ml three-neck flask. The mixture was degassed at 120° C. for 1 h. In an argon environment, the temperature was raised to 300° C. until the solution became transparent. Then the heating mantle was removed and the solution was allowed to cool to room temperature.

Synthesis of green-emitting CdSe/Cd$_{1-x}$Zn$_x$Se$_{1-y}$S$_y$/ZnS Quantum Dots: 20 ml of the Cd-oleate and Zn-oleate precursor solution (described above) was added to a 100 ml three-neck flask. The solution was degassed at 120° C. for 1 h. In an argon environment, the temperature was increased to 240° C. At 240° C., 0.4 umol of CdSe quantum dots in toluene was quickly injected followed by dropwise addition of a shell precursor solution (15.8 mg Se+256 mg S in 4 ml TOP) forming CdSe/Cd$_{1-x}$Zn$_x$Se$_{1-y}$S$_y$ quantum dots. In order to further passivate CdSe/Cd$_{1-x}$Zn$_x$Se$_{1-y}$S$_y$ quantum dots with a ZnS shell, 2 ml of 0.5M S/TOP was added. After 90 min, the heating mantle was removed and the solution was allowed to cool to room temperature. At around 60° C., 10 ml of hexane was added. The final CdSe/Cd$_{1-x}$Zn$_x$Se$_{1-y}$S$_y$/ZnS quantum dots were precipitated acetone twice and then re-dispersed in the desired solvent.

Synthesis of red-emitting CdSe/Cd$_{1-x}$Zn$_x$Se$_{1-y}$S$_y$/ZnS Quantum Dots: For synthesis of cadmium-based quantum dots with graded architecture, we've adopted and modified a previously reported method. 1 mmol CdO, 2 mmol Zn(Ac)$_2$, 5 ml Oleic Acid, and 15 ml Octadecene were placed in a three-neck flask. The mixture was then degassed for 1 h at 150° C. followed by a temperature increase to 300° C. After the solution became transparent, 0.4 mL 1M Se/TOP was quickly injected. To passivate the quantum dot surface, 0.3 mL of dodecanethiol was added dropwise. Then in order to fully passivate the quantum dot with a thick shell, 1 mL 2M S/TOP was added and allowed to react for several minutes. After cooling the solution, 10 ml Hexane was added.

Synthesis of PbSe/PbSe$_{1-y}$S$_y$/PbS Quantum Dots: For cation exchange of cadmium-based quantum dots into lead-based quantum dots, we've adopted and modified a previously reported method. 5 ml oleyl amine and 1 mmol 278 mg PbCl$_2$ was added to a three-neck flask. The solution was degassed at room temperature for 1 h. The temperature was raised to 190° C. in an argon environment. 1 ml of 0.05M CdSe/Cd$_{1-x}$Zn$_x$Se$_{1-y}$S$_y$/ZnS quantum dots in ODE was quickly injected and allowed to undergo cation exchange for desired reaction times. The heating mantle was then removed and allowed to cool to room temperature. At around 70° C., 4 ml of OA and 5 ml of hexane was added to the solution. The PbSe/PbSe$_{1-y}$S$_y$/PbS quantum dots were precipitated with methanol twice and dispersed in hexane. The final hexane solution was centrifuged at 1000 rpm (unreacted PbCl$_2$ precipitates) and the supernatant was collected for further characterization.

Characterization: The morphology of as-prepared CdSe quantum dots, CdSe/Cd$_{1-x}$Zn$_x$Se$_{1-y}$S$_y$/ZnS quantum dots, and PbSe/PbSe$_{1-y}$S$_y$/PbS quantum dots was examined using high resolution transmission electron microscope (Tecnai F30). Absorption and emission spectra up to NIR wavelengths were recorded using a UV-vis spectrometer (UV-2600, Shimadzu) and a spectrofluorophotometer (RF-5301PC, Shimadzu), respectively. For IR absorption spectra, Cary 5000 UV-Vis-NIR spectrophotometer which is capable to measure absorbance up to 3300 nm was utilized. For IR photoluminescence spectra, FieldSpec 3 Spectroradiometer was utilized. The transmission electron microscope (TEM) images were obtained by a JEOL 100CX II TEM. High resolution TEM images as well as EDS (point scan) measurements were obtained by FEI Tecnai G2 F30 TEM. EDS (area scan) was performed by LEO 1530 SEM. The X-ray diffraction (XRD) patterns were obtained using a PANalytical Empyrean Alpha-1 X-ray diffractometer.

While the present disclosure has been described in connection with a plurality of exemplary aspects, as illustrated in the various figures and discussed above, it is understood that other similar aspects can be used, or modifications and additions can be made to the described aspects for performing the same function of the present disclosure without deviating therefrom. For example, in various aspects of the disclosure, methods and compositions were described according to aspects of the presently disclosed subject matter. However, other equivalent methods or composition to these described aspects are also contemplated by the teachings herein. Therefore, the present disclosure should not be limited to any single aspect, but rather construed in breadth and scope in accordance with the appended claims.

What is claimed is:

1. A method comprising:
  transforming visible-light quantum dots into infrared-emitting quantum dots via a cation exchange reaction occurring over a reaction time;
  wherein the visible-light quantum dots (VLQDs) comprise:
    a VLQD inner core comprising a first VLQD semiconductor material;
    a VLQD outer shell comprising a second VLQD semiconductor material and having a shell thickness; and
    a VLQD gradient interface between the VLQD inner core and the VLQD outer shell, the VLQD gradient interface comprising the first and second VLQD semiconductor materials; and
  wherein the infrared-emitting quantum dots (IEQDs) comprise:
    an IEQD inner core comprising a first IEQD semiconductor material different from the first VLQD semiconductor material as a result of the cation exchange reaction;
    an IEQD outer shell comprising a second IEQD semiconductor material different from the second VLQD semiconductor material as a result of the cation exchange reaction, the IEQD outer shell having a shell thickness; and
    an IEQD gradient interface between the IEQD inner core and the IEQD outer shell different from the VLQD gradient as a result of the cation exchange reaction, the IEQD gradient interface comprising the first and second IEQD semiconductor materials.

2. The method of claim 1 further comprising:
  controlling one or more optical properties of the infrared-emitting quantum dots by at least one of:
    controlling a duration of the reaction time;
    tuning optical wavelengths of the visible-light quantum dots; or
    controlling spatial dimensions of the visible-light quantum dots.

3. The method of claim 2, wherein the IEQD gradient interface has an inner radius proximate the IEQD inner core and an outer radius proximate the JEQD outer shell;
  wherein a concentration of the first IEQD semiconductor material in the IEQD gradient interface at the inner radius is greater than a concentration of the first IEQD semiconductor material at the outer radius;
  wherein a concentration of the second IEQD semiconductor material in the IEQD gradient interface at the inner radius is less than a concentration of the second IEQD semiconductor material at the outer radius; and
  wherein the controlling one or more optical properties of the infrared-emitting quantum dots comprises controlling the duration of the reaction time, which in turn controls the IEQD outer shell thickness.

4. The method of claim 2, wherein the IEQD gradient interface has an inner radius proximate the IEQD inner core and an outer radius proximate the IEQD outer shell;
  wherein a concentration of the first IEQD semiconductor material in the IEQD gradient interface continually decreases from the inner radius to the outer radius;
  wherein a concentration of the second IEQD semiconductor material in the IEQD gradient interface continually increases from the inner radius to the outer radius; and
  wherein the controlling one or more optical properties of the infrared-emitting quantum dots comprises controlling the duration of the reaction time, which in turn controls the IEQD outer shell thickness.

5. The method of claim 2, wherein the infrared-emitting quantum dots are configured to emit IR light in a range selected from a group consisting of a short-range infrared range, a mid-range infrared range, and a combination thereof.

6. The method of claim 2 further comprising:
  synthesizing the visible-light quantum dots;
  wherein the cation exchange reaction is a one-step cation exchange reaction.

7. The method of claim 6, wherein the synthesizing comprises synthesizing the visible-light quantum dots at 240° C. using 2.45 nm diameter green-emitting CdSe quantum dots as seeds; and
  wherein the visible-light quantum dots have a diameter in a range of from 5.25 nm to 7.40 nm.

8. The method of claim 6, wherein the one-step cation exchange reaction comprises applying a substance selected from a group consisting of lead-salt, mercury-salt, and silver-salt to the visible-light quantum dots.

9. The method of claim 2, wherein after the cation exchange reaction, the tuning comprises maintaining the infrared-emitting quantum dots in contact with lead-salt, mercury-salt, or silver-salt for the reaction time, thereby synthesizing the IEQD outer shell having a predetermined thickness for each of the infrared-emitting quantum dots.

10. The method of claim 2 further comprising applying the infrared-emitting quantum dots into direct contact with a substrate to form a quantum dot panel.

11. The method of claim 10, wherein applying the infrared-emitting quantum dots directly to the substrate comprises arranging the infrared-emitting quantum dots into sub-pixel arrays; and
  wherein the sub-pixel arrays comprise:
    a first sub-pixel array configured to emit IR light at a first wavelength; and
    a second sub-pixel array configured to emit IR light at a second wavelength that is different from the first wavelength.

12. The method of claim 11, wherein the first sub-pixel array and second sub-pixel array are configured to concurrently emit the first and second wavelengths, respectively.

13. The method of claim 2, wherein the infrared-emitting quantum dots have a colloidal stability in solution for at least six months.

14. The method of claim 2, wherein absorption wavelengths of the infrared-emitting quantum dots are substantially unchanged for more than 30 days.

15. A method comprising:
synthesizing visible-light quantum dots (VLQDs) that comprise:
a VLQD inner core comprising CdSe;
a VLQD outer shell comprising ZnS and having a shell thickness; and
a VLQD gradient interface between the VLQD inner core and the VLQD outer shell, the VLQD gradient interface comprising $Cd_{1-x}Zn_xSe_{1-y}S_y$; and
transforming the visible-light quantum dots into infrared-emitting quantum dots via a cation exchange reaction occurring over a reaction time; and
controlling absorption properties of the infrared-emitting quantum dots;
wherein the infrared-emitting quantum dots (IEQDs) comprise:
an IEQD inner core comprising at least one of PbSe, $Ag_2Se$, or HgSe as a result of the cation exchange reaction;
an IEQD outer shell comprising at least one of PbS, $Ag_2S$, or HgS as a result of the cation exchange reaction, the IEQD outer shell having a shell thickness; and
an IEQD gradient interface comprising at least one of $PbSe_{1-y}S_y$, $Ag_2Se_{1-x}S_x$, or $HgSe_{1-x}S_x$ as a result of the cation exchange reaction, the IEQD gradient interface between the IEQD inner core and the IEQD outer shell;
wherein the controlling is selected from the group consisting of controlling a duration of the reaction time, tuning optical wavelengths of the visible-light quantum dots, controlling spatial dimensions of the visible-light quantum dots, and a combination thereof; and
wherein the absorption properties of the infrared-emitting quantum dots are in a range of approximately 1000 nm to approximately 3000 nm.

16. The method of claim 15, wherein the infrared-emitting quantum dots have a colloidal stability in solution for at least six months.

17. The method of claim 15, wherein absorption wavelengths of the infrared-emitting quantum dots are substantially unchanged for more than 30 days.

* * * * *